(12) United States Patent
Tanaka

(10) Patent No.: US 9,978,798 B2
(45) Date of Patent: May 22, 2018

(54) SENSORS WITH VARIABLE SENSITIVITY TO MAXIMIZE DATA USE

(71) Applicants: SONY CORPORATION, Tokyo (JP); SONY PICTURES ENTERTAINMENT INC., Culver City, CA (US)

(72) Inventor: Kazunori Tanaka, Irvine, CA (US)

(73) Assignees: SONY CORPORATION, Tokyo (JP); SONY PICTURES ENTERTAINMENT INC., Culver City, CA (US)

( * ) Notice: Subject to any disclaimer, the term of this patent is extended or adjusted under 35 U.S.C. 154(b) by 196 days.

(21) Appl. No.: 14/817,075

(22) Filed: Aug. 3, 2015

(65) Prior Publication Data

US 2017/0040376 A1   Feb. 9, 2017

(51) Int. Cl.
*H01L 27/146* (2006.01)
*H01L 31/0248* (2006.01)
*H04N 5/355* (2011.01)

(52) U.S. Cl.
CPC .. *H01L 27/14643* (2013.01); *H01L 27/14609* (2013.01); *H01L 31/0248* (2013.01); *H04N 5/35518* (2013.01); *H01L 27/14603* (2013.01)

(58) Field of Classification Search
CPC ............... H01L 27/14643; H01L 27/14609
USPC ............................................. 250/208.1
See application file for complete search history.

(56) References Cited

U.S. PATENT DOCUMENTS

| | | | |
|---|---|---|---|
| 6,473,333 B1 * | 10/2002 | Tachibana | G11C 11/22 257/903 |
| 7,508,422 B2 | 3/2009 | Kamon et al. | |
| 7,948,525 B2 | 5/2011 | Takahashi et al. | |
| 2007/0206407 A1 * | 9/2007 | Johnson | G01R 33/06 365/158 |
| 2008/0258045 A1 * | 10/2008 | Oike | H04N 5/3559 250/208.1 |

* cited by examiner

*Primary Examiner* — Seung C Sohn
(74) *Attorney, Agent, or Firm* — Procopio, Cory, Hargreaves & Savitch LLP

(57) ABSTRACT

Recording photons incident on an image sensor; and storing the recorded photons on the image sensor in varying densities, wherein the photons are recorded in varying densities by storing electrons non-linearly. Key words include a sensor and storing non-linearly.

12 Claims, 5 Drawing Sheets

SENSORS WITH VARIABLE SENSITIVITY TO MAXIMIZE DATA USE

BACKGROUND

Field of the Invention

The present invention relates to sensors, and more specifically, to variable sensitivity sensors to maximize data use.

Background

Sensors, whether digital or analog, tend to measure and record physical phenomena (such as sound or light) in a linear fashion. For example, when a number of photons are incident on a sensing element of an imaging sensor, the sensing element stores a certain amount of charge (e.g., in a capacitor), and when the number of photons are doubled, for example, the amount of stored charge on the sensor also doubles.

SUMMARY

The present invention provides for sensing elements that record data in varying densities that is similar to how the data will be used. In one implementation, for example, the data is recorded logarithmically.

In one implementation, a sensing element is disclosed. The sensing element includes: a sensor configured to record photons incident on the sensor in varying densities, wherein the photons are recorded in varying densities by storing electrons non-linearly in relation to the photons.

In another implementation, a method is disclosed. The method includes: recording photons incident on an image sensor; and storing the recorded photons on the image sensor in varying densities, wherein the photons are recorded in varying densities by storing electrons non-linearly in relation to the photons.

In another implementation, an apparatus is disclosed. The apparatus includes: means for recording photons; and means for storing the recorded photons onto the means for recording photons in varying densities, wherein the photons are recorded in varying densities by storing electrons non-linearly in relation to the photons.

Other features and advantages of the present invention should be apparent from the present description which illustrates, by way of example, aspects of the invention.

BRIEF DESCRIPTION OF THE DRAWINGS

The details of the present invention, both as to its structure and operation, may be gleaned in part by study of the appended further drawings, in which like reference numerals refer to like parts, and in which.

DETAILED DESCRIPTION

Figure 1:
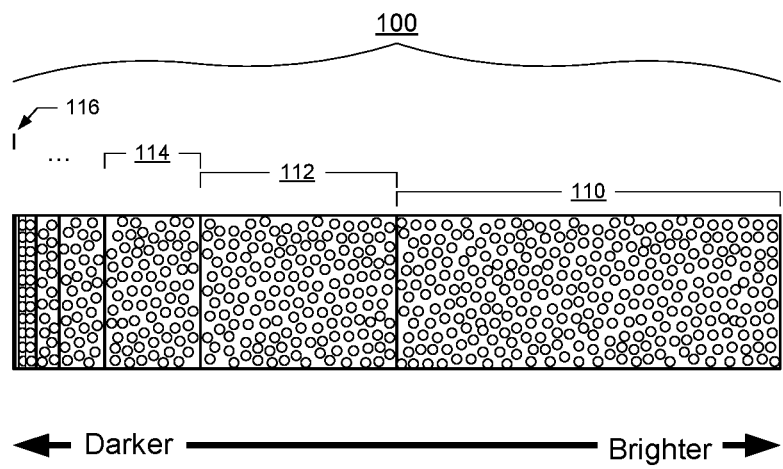
FIG. 1 is a graphical representation of a conventional sensing element (e.g., of a camera) which stores electrons as it captures them linearly in 14 stops.

The above-described configuration of measuring and recording physical phenomena (such as sound or light) in a linear fashion, however, is inefficient because the end use may not be in such a linear space. For example, for sound or light, the human system (e.g., human eyes) treats the data logarithmically. For light, every doubling of the data (e.g., doubling of the number of photons) is sensed as a linear increase in perceptive brightness. For example, if an input of 1 unit is sensed a certain way, an input of 2 (i.e., an increase of 1) will be sensed as more input, but an input of 4 (i.e., an increase of 2 instead of 1 as before) would be needed for a similar increase in stimulus. But because of the linearity of the sensor's data recording in contrast to the exponentially increasing amount of input for useful information, the sensor reaches saturation very rapidly, and limits the dynamic range of the sensor. However, it would be desirable to be able to record a wider dynamic range of data for the sensor.

Currently, a good imaging sensor used in a consumer digital camera sensor captures about 14 stops of dynamic range, measured in doublings of the distance between zero (i.e., the value with no input) and the darkest recordable value (lowest non-zero-input value) before it reaches saturation (brightest recordable value). A stop is a unit used to quantify ratios of light or exposure, with each added stop meaning a factor of two, and each subtracted stop meaning a factor of one-half. The real world that our eyes see varies from starlight to the bright sun, which spans about 40 stops of dynamic range (a ratio of 1:160,000,000,000). While paper printing and typical computer displays currently show only around 8 stops of dynamic range, future high-dynamic range display devices may be able to show the limitations of even our best consumer cameras.

A conventional solution for digital imaging uses sensing elements that record the amount of incident photons by storing electrons in a linear fashion. Within such a sensor, a photodiode may release an electron when a photon hits it, an applied electric field pushes it along, and this electron gets stored in a capacitor. After the exposure is finished, a readout mechanism measures the voltage of the capacitor so that the amount of light (or the number of incident photons) that was incident on the sensing element can be deduced. Thus, the number of electrons stored is proportional to the incident number of photons, which is proportional to the voltage on the capacitor, and the sensing element registers what amounts to scene-linear information.

In those terms, when considering the electrons in the sensing element's capacitor, the brightest stop is represented by half of all the electrons accumulated. The next brightest stop is represented by the electrons of half that amount, and so on. But the brightest stop on a linear sensor, while using up half the recorded data storable on a sensing element, only corresponds to a single stop's worth of information. The top two stops take up three-fourths of the recorded data, etc. Conversely, the bottom stops have so little data allocated to them that they become very noisy. This is an inefficient technique for human-viewing purposes.

For example, FIG. 1 is a graphical representation of a conventional sensing element 100 (e.g., of a camera) which stores electrons as it captures them linearly in 14 stops. In FIG. 1, since the conventional sensing element 100 is shown as storing the electrons linearly, starting at stop 1 (110) being the brightest to stop 14 (116) being the darkest, stop 1 (110) uses up one-half of the recorded data storable on the sensing element 100, while it corresponds to only a single stop's worth of information. Next stop 2 (112) uses up one-half of the remaining recorded data, and stop 3 (114) uses up one-half of the remaining recorded data after stop 2 (114), and so on. For example, if the total number of electrons incident on the sensing element 100 is 45,000, then stop 1 (110) uses up one-half or 22,500 electrons, stop 2 (112) uses up one-half of the remaining 22,500 or 11,250 electrons, stop 3 (114) uses up one-half of the remaining 11,250 or 5,625, until stop 14 (116) uses only $(1/(2^{14}))*45,000=(1/16,384)*45,000=2.75$ electrons. It should be noted that term "stop" as used in this paragraph refers to a unit used to quantify ratios of light and is not a physical element of a camera.

To address the shortcomings of conventional cameras with above-described sensing elements, several implementations as disclosed herein provide for sensing elements that store data in varying densities instead of scene-linearly (as described above in connection with FIG. 1). In one implementation, a sensing element that stores data logarithmically is disclosed. In another implementation, all sensing elements are covered by a varying neutral density filter (or some other architecture that provides variable sensitivity), which cuts down on the amount of light that reaches the sensing element. By recreating the image using sensing elements that have different exposures, a higher-dynamic range image can be recreated. Thus, in general, a higher-dynamic range image can be generated by adjusting the amount of light that reaches the sensor, for example, using a varying neutral density filter.

After reading this description it will become apparent how to implement the invention in various implementations and applications. However, although various implementations of the present invention will be described herein, it is understood that these implementations are presented by way of example only, and not limitation. As such, this detailed description of various implementations should not be construed to limit the scope or breadth of the present invention.

Figure 2:
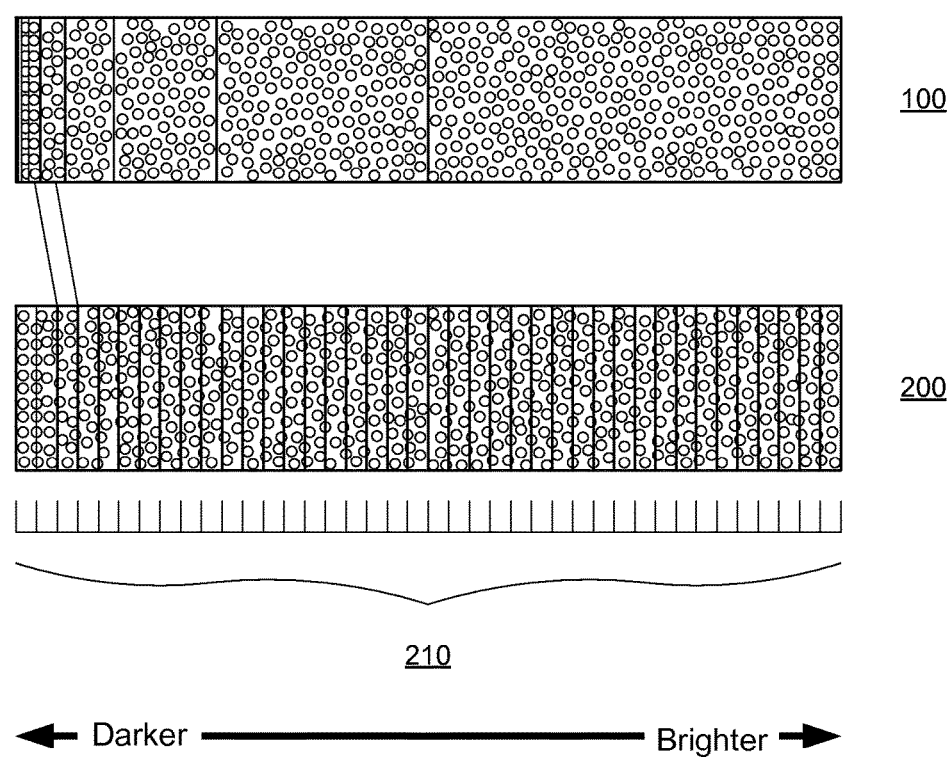
FIG. 2 is a graphical representation of a log sensing element which stores electrons as it captures them logarithmically in 40 stops in accordance with one implementation of the present invention.

In one implementation, a sensing element is disclosed where the data is recorded more efficiently by having the data stored in a space that is similar to the way it will eventually be used. In this implementation, the sensing element is a non-linear sensing element that stores or records data in varying densities. For example, FIG. 2 is a graphical representation of a log sensing element or apparatus 200 which stores electrons as it captures them logarithmically in 40 stops (210) in accordance with one implementation of the present invention. In the illustrated implementation of FIG. 2, the log sensing element 200 is shown with 40 stops in comparison to the linear sensing element 100 with 14 stop. It can be seen that each stop of the log sensing element 200 (assuming 45,000 electrons sensed, each stop contains 1125 electrons) contains more electrons than the average stop (assuming 45,000 electrons sensed, each stop contains from 22,500 to 3 electrons) of the linear sensing element 100.

To physically implement a non-linear sensing element such as the log sensing element 200 as illustrated in FIG. 2 and described above, several different elements can be used.

In general, the rate at which electrons are accumulated in storage can be slowed down by changing the amount of electrons that gets stored. For example, in one implementation, an electric field generator that generates an electric field (which is used to push electrons into a storage unit (e.g. a capacitor)) is configured to decrease its generation of the electric field as more charge is accumulated in the capacitor. In another implementation, an electric field generator is configured to generate electric field which decreases as more electrons are accumulated in a storage unit coupled to the log sensing element 200.

When an electric field is applied and an electron is knocked out of the semiconductor of a photodiode, the positive hole that is created, as well as electron, is pushed to opposite poles of the capacitor. In this case, the photodiode is configured to change the rate at which positive holes are replenished. In another implementation, the photodiode is configured to accumulate positive holes instead of replenishing them to neutrality. That is, the photodiode in a sensing element could be the positive pole of the capacitor for that sensing element. Since the electrons are not replenished, as more get knocked out, the less likely it becomes for more to be knocked out. However, regardless of the exact implementation, a non-linearly-recording sensor such as a logarithmically-recording sensor would be substantially more efficient than a linear sensor for an imaging device which is meant to create human-viewable images. Moreover, the logarithmically-recording sensor would allow for the recording of dynamic ranges currently not possible. Further, the implementation can be generalized to any non-linear curves other than logarithmic.

Figure 3:
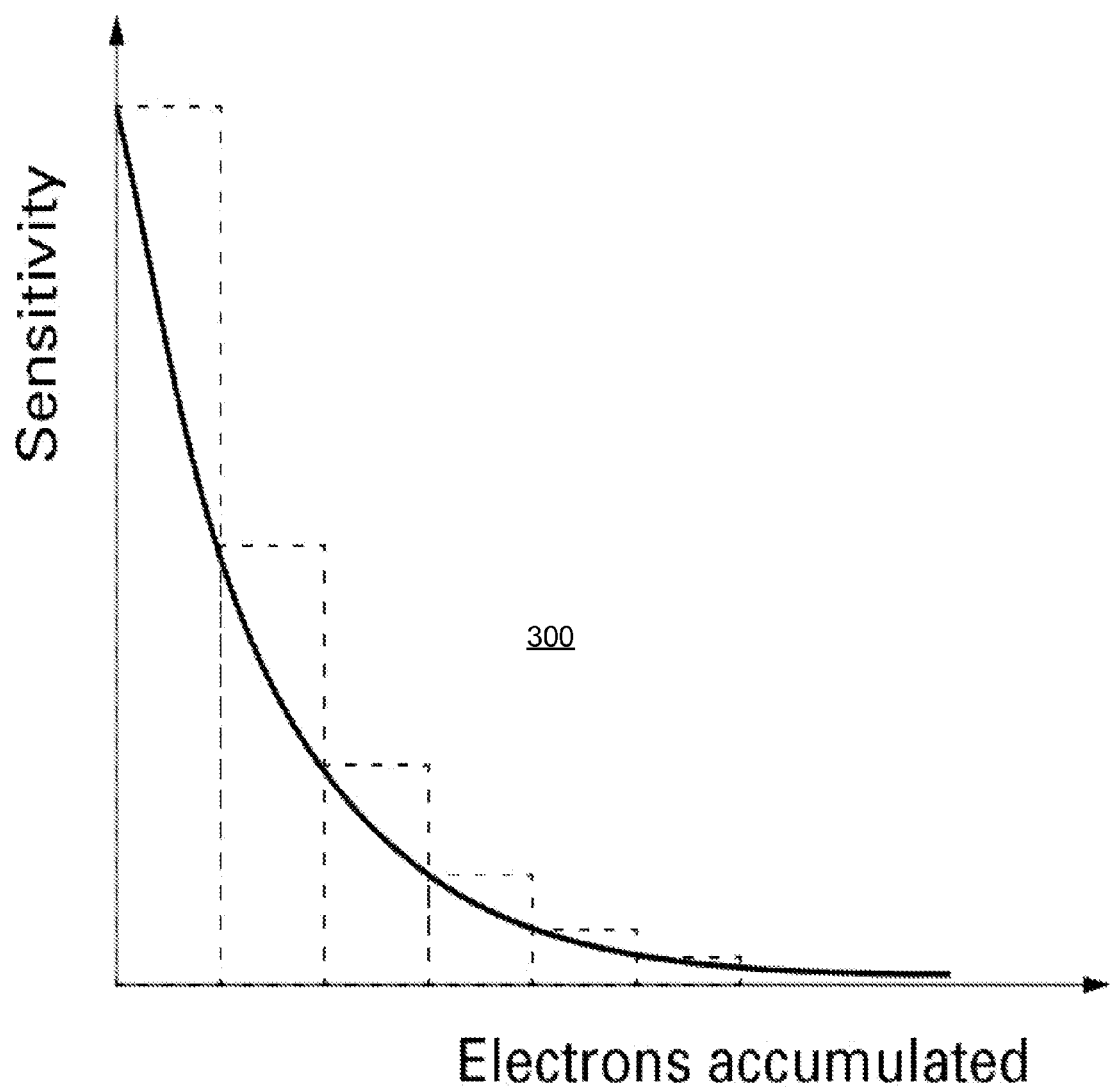
FIG. 3 illustrates a graph showing the sensitivity of a non-linear sensor decreasing with the increase in the number of accumulated electrons.

FIG. 3 illustrates a graph 300 showing the sensitivity of a non-linear sensor (e.g., a log sensing element 200) decreasing with the increase in the number of accumulated electrons. In the illustrated implementation of FIG. 3, the sensitivity of the sensor decreases by half each time a certain number of electrons (1,125 electrons for 45,000 total electrons for 40 stops) is accumulated. Therefore, the graph 300 shows the logarithmic decrease as expected. However, it should be noted that the decrease does not have to be exactly logarithmic, but rather it can be logarithmic-like or any non-linear function which is substantially similar to the way the data will be used. For example, for each accumulation of a certain number of electrons, rather than decreasing the sensitivity by half (i.e., by dividing the previous number by 2), it can be programmed to decrease, for example, by dividing by 2.2, 2.0, 2.5, 2.1, and so on. The function should be relatively smooth and decrease in sensitivity. A sensor with a sensitivity decreasing as described above with an accumulation of electrons will be an improvement over the simple linear sensitivity that is used in current sensors. Accordingly, once the sensitivity curve is known and reproducible, the actual data of the scene can be restored using the known sensitivity curve with substantially high dynamic range than a sensor with a linear sensitivity curve.

Figure 4A:
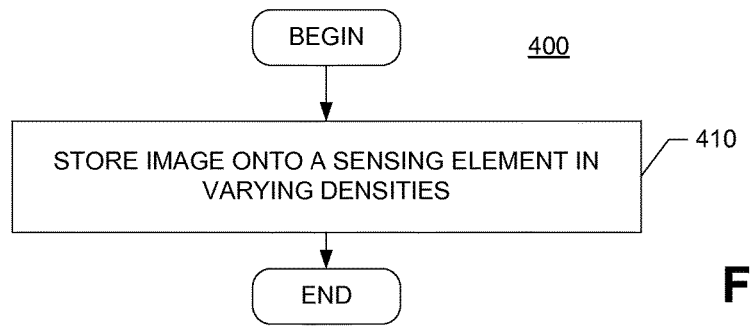
FIG. 4A is a flow diagram illustrating a method for capturing and recording an image onto a sensing element in accordance with one implementation of the present invention.

FIG. 4A is a flow diagram illustrating a method 400 for capturing and recording an image onto a sensing element in accordance with one implementation of the present invention. In the illustrated implementation of FIG. 4A, an image is captured and stored onto a sensing element, at step 410, which stores electrons in varying densities. In one example, an image is captured and stored logarithmically in 40 stops by configuring the sensing element to steer the electrons such that an equal number of electrons are stored for each stop.

Figure 4B:
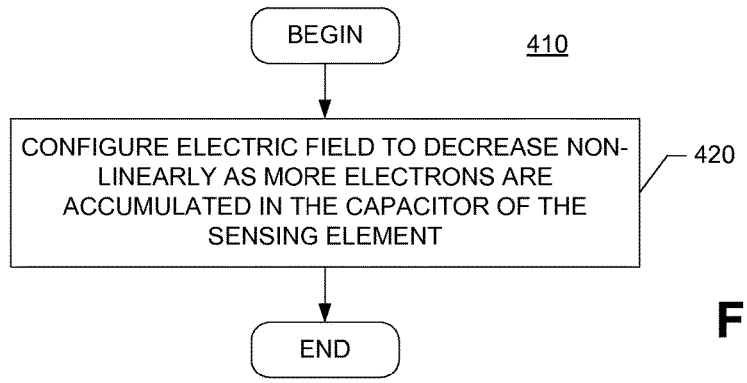
FIG. 4B is another flow diagram illustrating one implementation of a method for storing the captured and recorded image non-linearly.

FIG. 4B is another flow diagram illustrating one implementation of step 410 for storing the image non-linearly. To physically implement the storage of the image non-linearly, in one implementation, an electric field, which is used to push electrons into a capacitor, is configured to decrease non-linearly as more charge is accumulated in the capacitor, at step 420. As stated above, when an electric field is applied and an electron is knocked out of the semiconductor of a photodiode, the positive hole that is created, as well as the electron, is pushed to opposite poles of the capacitor.

Figure 4C:
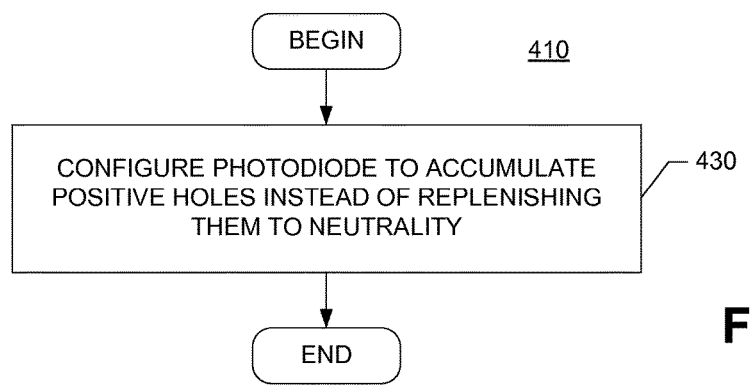
FIG. 4C is another flow diagram illustrating another implementation of a method for storing the captured and recorded image non-linearly.

FIG. 4C is another flow diagram illustrating another implementation of step 410 for storing the image non-linearly. To physically implement the storage of the image non-linearly, a photodiode is configured to accumulate positive holes instead of replenishing them to neutrality, at step 430. That is, the photodiode in a sensing element could be the positive pole of the capacitor for that sensing element. Since the electrons are not replenished, as more get knocked out, the less likely it becomes for more to be knocked out.

Figure 5:
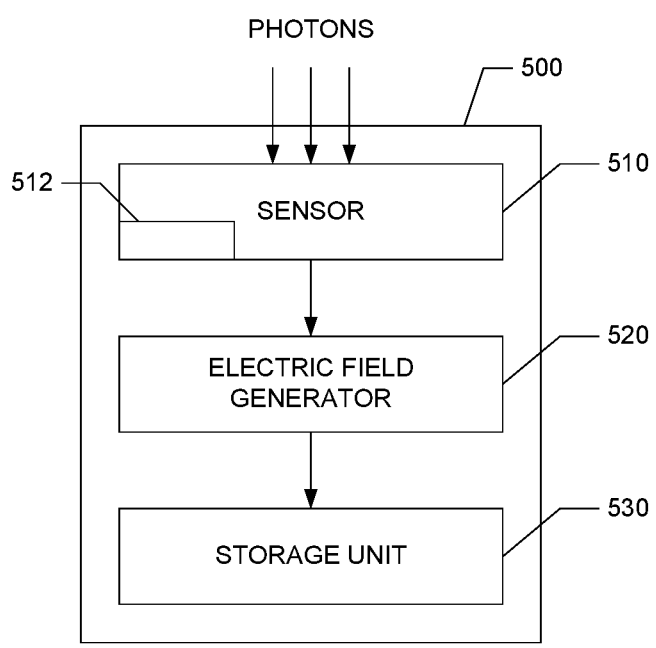
FIG. 5 is a block diagram of a sensing element in accordance with one implementation of the present disclosure.

FIG. 5 is a block diagram of a sensing element 500 in accordance with one implementation of the present disclosure. In the illustrated implementation of FIG. 5, the sensing element 500 includes a sensor 510, a storage unit 530, and an electric field generator 520. The sensor 510 is configured to record photons incident on the sensor in varying densities. The storage unit 530 is coupled to the sensor 510 and is configured to non-linearly store electrons corresponding to the photons recorded by the sensor in varying densities. The electric field generator 520 is coupled to the storage unit 530 and is configured to generate electric field which decreases as more electrons are stored in the sensor. In one implementation, the generated electric field enables non-linear storage of the electrons in the storage unit 530. In one implementation, the sensor 510 includes a photodiode 512 configured to change a rate at which positive holes are replenished. In another implementation, the sensor 510 is sometimes referred to as means for recording photons and the storage unit 530 is sometimes referred to as a capacitor or as means for non-linearly storing electrons corresponding to the photons recorded in varying densities.

The foregoing methods and apparatus are susceptible to many variations. Additionally, for clear and brief description, many descriptions of the methods and apparatus have been simplified. Many descriptions use terminology and structures of specific standards. However, the disclosed methods and apparatus are more broadly applicable.

Those of skill in the art will appreciate that the various illustrative logical blocks, modules, units, and algorithm steps described in connection with the implementations disclosed herein can often be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular constraints imposed on the overall system. Skilled persons can implement the described functionality in varying ways for each particular system, but such implementation decisions should not be interpreted as causing a departure from the scope of the invention. In addition, the grouping of functions within a unit, module, block, or step is for ease of description. Specific functions or steps can be moved from one unit, module, or block without departing from the invention.

The steps of a method or algorithm and the processes of a block or module described in connection with the implementations disclosed herein can be embodied directly in hardware, in a software module executed by a processor, or in a combination of the two.

The above description of the disclosed implementations is provided to enable any person skilled in the art to make or use the invention. Various modifications to these implementations will be readily apparent to those skilled in the art, and the generic principles described herein can be applied to other implementations without departing from the spirit or scope of the invention. For example, although above descriptions focus on imaging sensors, methods and apparatus described above can be applied to any type of sensors including an audio sensor, a video sensor, and other similarly-configured sensors such as a temperature sensor. Accordingly, the techniques are not limited to the specific examples described above. Thus, it is to be understood that the description and drawings presented herein represent a presently preferred implementation of the invention and are therefore representative of the subject matter that is broadly contemplated by the present invention. It is further understood that the scope of the present invention fully encompasses other implementations that may become obvious to those skilled in the art and that the scope of the present invention is accordingly limited by nothing other than the appended claims.

The invention claimed is:

1. A sensing element, comprising:
   a sensor configured to record photons incident on the sensor in varying densities;
   a storage unit coupled to the sensor and configured to non-linearly store electrons corresponding to the photons recorded by the sensor in varying densities; and
   an electric field generator coupled to the storage unit and configured to generate electric field which decreases as more electrons are stored in the sensor,
   wherein the generated electric field enables non-linear storage of the electrons in the storage unit.

2. The sensing element of claim 1, wherein the sensor is an image sensor.

3. The sensing element of claim 1, wherein the storage unit is configured to store the electrons logarithmically.

4. The sensing element of claim 1, wherein the sensor includes a photodiode configured to change a rate at which positive holes are replenished.

5. A method, comprising:
   recording photons incident on an image sensor in varying densities; and
   non-linearly storing electrons corresponding to the photons recorded by the image sensor in varying densities,
   wherein the electrons are stored non-linearly using an electric field which decreases as more electrons are accumulated on the image sensor.

6. The method of claim 5, wherein recording the photons in varying densities of electrons comprises storing the electrons logarithmically.

7. The method of claim 5, further comprising
   changing a rate at which positive holes are replenished using a photodiode.

8. An apparatus, comprising:
   means for recording photons in varying densities; and
   means for non-linearly storing electrons corresponding to the photons recorded in varying densities,
   wherein the electrons are stored non-linearly using an electric field which decreases as more electrons are accumulated on the means for recording.

9. The apparatus of claim 8, wherein the means for non-linearly storing is a capacitor.

10. The apparatus of claim 9, wherein the means for non-linearly storing includes means for pushing electrons to opposite poles of the capacitor.

11. The apparatus of claim 8, wherein the means for recording includes a photodiode.

12. The apparatus of claim 11, wherein the photodiode is configured to change a rate at which positive holes are replenished.

\* \* \* \* \*